(12) United States Patent
Riedlinger et al.

(10) Patent No.: US 6,550,034 B1
(45) Date of Patent: Apr. 15, 2003

(54) BUILT-IN SELF TEST FOR CONTENT ADDRESSABLE MEMORY

(75) Inventors: Reid James Riedlinger, Fort Collins, CO (US); Donald R. Weiss, Fort Collins, CO (US)

(73) Assignee: Hewlett Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/505,549

(22) Filed: Feb. 17, 2000

(51) Int. Cl.⁷ .............................................. G01R 31/28
(52) U.S. Cl. ...................................................... 714/733
(58) Field of Search ................................ 714/718, 724, 714/733; 365/49

(56) References Cited

U.S. PATENT DOCUMENTS

| | | | | |
|---|---|---|---|---|
| 4,079,453 A | | 3/1978 | Dahl | 327/132 |
| 5,289,403 A | * | 2/1994 | Yetter | 365/49 |
| 5,553,082 A | | 9/1996 | Connor et al. | 714/736 |
| 6,011,734 A | | 1/2000 | Pappert | 365/200 |
| 6,173,425 B1 | | 1/2001 | Knaack et al. | 714/718 |
| 6,286,116 B1 | | 9/2001 | Bhavsar | 714/720 |

FOREIGN PATENT DOCUMENTS

| | | | | |
|---|---|---|---|---|
| EP | 0451985 | 10/1991 | | G11C/29/00 |
| JP | 8273399 | 3/1995 | | G11C/29/00 |
| WO | WO 97/04459 | 2/1997 | | G11C/29/00 |
| WO | WO 00/11674 | 3/2000 | | G11C/7/00 |

OTHER PUBLICATIONS

Sidorowicz et al., Verification of CAM Tests of Input Stuck-at Faults, University of Waterloo, IEEE, p. 1–7, 1998.*
Kornachuk et al. A High Speed Embedded Cache Design with Non–intrusive BIST, IEEE, p. 40–45, 1994.*
United Kingdom Search Report for Application No. GB 0102262.3 dated Mar. 11, 2002.
United Kingdom Search Report for Application No. GB 0102262.3 dated Nov. 28, 2001.

* cited by examiner

Primary Examiner—Albert Decady
Assistant Examiner—Shelly A Chase (57) ABSTRACT

A system and method are disclosed which provide a built-in self test (BIST) for a content addressable memory (CAM) structure. In a preferred embodiment, an integrated circuit (chip) comprises a CAM structure that is accessible by a processor to satisfy memory access requests and a BIST implemented within such chip, which enables testing the integrity of the CAM structure. Such a preferred embodiment comprises a BIST that enables testing the integrity of the CAM structure that does not require circuitry for reading memory data out of the CAM structure. A preferred embodiment can also be utilized for testing a random access memory structure. In a preferred embodiment, a CAM BIST comprises logic capable of generating test values (e.g., a test pattern), a shift register that temporarily stores the test values generated by the logic, and compare circuitry that determines whether a test value matches an entry within the CAM structure.

20 Claims, 5 Drawing Sheets

BUILT-IN SELF TEST FOR CONTENT ADDRESSABLE MEMORY

TECHNICAL FIELD

This invention relates in general to a built-in self test for an integrated circuit, and in specific to a built-in self test for content adjustable memory.

BACKGROUND

Built-in self tests (BISTs) are commonly implemented within integrated circuits (e.g., chips) of the prior art to test the accuracy of such chips. For example, BISTs have been implemented in the prior art to allow for testing the accuracy of random access memory (RAM). However, many chips utilize content addressable memory (CAM). As is well known in the art, RAM memory, such as static RAM (SRAM) or dynamic RAM (DRAM), is commonly implemented for storing data. As is also well known in the art, a CAM structure is typically a RAM that comprises associated circuitry (e.g., a comparator) for comparing received data with data stored therein very quickly. As an example, cache structures implemented for processors typically include a translation look-aside buffer (TLB), which is generally a large CAM structure. Generally, when an instruction being executed by the processor requests access to memory (e.g., to read from or write to a memory address), the cache's TLB receives a virtual address for such memory access request and translates the virtual address to a physical address.

However, prior art designs have not implemented a BIST for testing a CAM structure. That is, a BIST for testing a CAM structure has not been utilized in prior art chips. Instead, CAM structures are typically tested in the prior art using off-chip software programs. Utilizing such off-chip testing programs of the prior art to test CAM structures typically requires a large amount of testing time. For example, an undesirably long time is typically required to test a TLB of the prior art.

In testing prior art chips that include CAM structures, a significant portion of the test time is typically required to test the CAM structure. For instance, testing a CAM structure utilizing testing procedures of the prior art may require thousands of clock cycles. As an example of a typical method used for testing a CAM structure, suppose a CAM structure is implemented on a chip for a TLB. To test the cells of the CAM used for the TLB, the entire CAM array may first be initialized to 0. Thus, the chip must be set into a mode in which a virtual address of all 0's can be input for each entry of the TLB. After each of the entries in the TLB are set to a virtual address of all 0's (e.g., virtual address =000000000), then a test address of all 0's and a walking 1 may be utilized to test the TLB's entries. For instance, a test address having a 1 only in its most significant bit position (e.g., test address 100000000) may be input to the TLB to ensure that the TLB does not translate this test address as matching with one of its entries (i.e., to ensure that a "miss" or "non-match" occurs for every entry of the TLB. If a "hit" (or "match") is detected for any entry, then it is determined that the CAM structure failed (i.e., that the CAM structure is defective). After testing each entry for a test address having a 1 for its most significant bit position, the 1 is shifted or "walked" over to the next lower bit of the test address (e.g., test address=010000000) and is input to the TLB. The test is repeated on the TLB with the 1 being walked through each bit position of the test address, and if a "hit" (or "match") is detected for any of the test addresses then it is determined that the CAM structure has failed.

Once the test has been completed for a walking 1, the test is typically repeated by initializing every cell of the CAM array to 1 and testing the CAM with a test address having all 1's and a walking 0. For example, each of the entries in the TLB may be set to a virtual address of all 1's (e.g., virtual address=111111111), then a walking 0 can be utilized to test the TLB's entries. For instance, a test address having a 0 only in its most significant bit position (e.g., test address= 011111111) may be input to the TLB to ensure that the TLB does not translate this test address as matching with one of its entries (i.e., to ensure that a "miss" or "non-match" occurs for every entry of the TLB. If a "hit" (or "match") is detected for any entry, then it is determined that the CAM structure failed (i.e., that the CAM structure is defective). After testing each entry for a test address having a 0 for its most significant bit position, the 0 is shifted or "walked" over to the next lower bit of the test address (e.g., test address=101111111) and is input to the TLB. The test is repeated on the TLB with the 0 being walked through each bit position of the test address, and if a "hit" (or "match") is detected for any of the test addresses then it is determined that the CAM structure has failed.

Such a method of testing typically requires many clock cycles utilizing an off-chip testing program of the prior art. Accordingly, prior art CAM testing methods generally require an undesirably long time, which result in an overall longer production time. Additionally, because such off-chip testing requires a long time, the effective cost associated with producing and testing a chip of the prior art is undesirably high. Not only do prior art. CAM testing programs typically require an undesirably high number of clock cycles to complete, but such off-chip testing programs are typically serial clock tests that operate at approximately 10 megahertz (MHz). Thus, even if the processor speed of a chip is 500 MHz, the CAM testing is performed at approximately 10 MHz. As a result, prior art methods of performing CAM testing require an undesirably long time.

As discussed above, BISTs have been utilized for testing RAM structures of the prior art. However, such RAM BISTs are not readily capable of being implemented for CAM structures. That is, prior art RAM BISTs can not be implemented for CAM structures without making unobvious changes to such prior art RAM BISTs. Generally, RAM BISTs are not easily adapted as CAM BISTs because of the difference in the operation of a RAM structure and a CAM structure. For instance, during operation a RAM structure can typically have data written thereto and read therefrom. Accordingly, a RAM BIST typically writes data to the RAM structure, and then reads the data out of the RAM structure to ensure that the data read out is the same as the data that was written to the RAM.

However, the operation of a CAM structure is much different. That is, memory data can typically be written to a CAM structure, but generally it cannot be read from the CAM structure. Instead, the CAM structure typically receives data and compares it with memory data stored within the CAM. Typically, a CAM does not include circuitry for reading the actual memory data out of the CAM, but instead includes circuitry for comparing received data with the memory data stored therein to determine if a match is made. Because the memory data is not read out of the CAM, testing is typically more complicated for CAM structures than for RAM structures. For instance, testing CAM structures generally involves writing memory data to the CAM and then inputting various test patterns of data to ensure that the CAM structure correctly recognizes whether the input data matches an entry stored in the CAM. Such testing is generally more complex than the relatively simple method of writing memory data in and reading memory data out typically utilized in RAM structures.

Some CAM structures of the prior art include circuitry for reading out memory data That is, some CAM structures of the prior art include circuitry for reading out the actual memory data stored within the CAM. Therefore, the testing of such CAM structures is simplified and may be implemented much like testing methods of RAM structures (e.g., write memory data in and read memory data out). However, some testing is typically required for the CAM's compare circuitry to ensure that it recognized matches and mismatches in data. Also, the read circuitry implemented for such CAM structures results in an undesirably large amount of additional overhead for implementing such read circuitry. For instance, read circuitry included within such CAM structures increases the cost of implementing the CAMs and increases the amount of surface area consumed by the CAMs. Such overhead is undesirable, especially considering that the read circuitry of the CAM is utilized solely for testing the CAM, and is not utilized during the CAM's actual operation. Therefore, implementing a CAM structure that includes read circuitry for testing the CAM is generally undesirable.

SUMMARY OF THE INVENTION

In view of the above, a desire exists for a BIST for a CAM structure. A further desire exists for CAM BIST that enables a CAM structure to be tested in a timely manner, thereby improving the efficiency of production and testing of a chip that includes a CAM structure. More specifically, a desire exists for a CAM BIST that enables for a CAM structure to be tested easily, quickly, and accurately. Still a further desire exists for a BIST that may be easily implemented for testing a CAM structure, without requiring a large amount of additional overhead for such BIST. That is, a desire exists for a BIST implementation that enables efficient testing of a CAM structure, wherein such BIST implementation does not require a large amount of overhead (e.g., does not require a large amount of additional circuitry for the BIST implementation).

These and other objects, features and technical advantages are achieved by a system and method which provide a BIST for a CAM structure. In a preferred embodiment, an integrated circuit (chip) comprises a CAM structure that is accessible by a processor to satisfy memory access requests. A preferred embodiment further comprises a BIST implemented within such chip, which enables testing the integrity of the CAM structure. In a most preferred embodiment, the BIST is implemented to enable testing a CAM structure that is implemented as a TLB for a cache. However, in alternative embodiments, such BIST may be implemented to test any type of CAM structure. Furthermore, in a preferred embodiment, a BIST may be implemented to not only test the integrity of a CAM structure, but may also be used to test the integrity of a RAM structure.

In a preferred embodiment, a CAM BIST comprises logic capable of generating test values (e.g., a test pattern), a shift register that temporarily stores the test values generated by the logic, and compare circuitry that determines whether a test value matches an entry within the CAM structure. By implementing a BIST for the CAM structure, the CAM structure's integrity can be tested in a much more efficient manner than is possible utilizing off-chip CAM testing programs of the prior art. For instance, in a preferred embodiment, the number of clock cycles required to perform a CAM test is substantially less than the number of clock cycles required to perform a similar test utilizing an off-chip testing program of the prior art. Furthermore, a preferred embodiment allows for the CAM testing to be performed "at speed." That is, the BIST of a preferred embodiment is capable of testing a CAM structure at the processor speed (e.g., 500 MHz), whereas prior art off-chip testing programs are typically limited to an operating speed of approximately 10 MHz. Accordingly, a preferred embodiment provides a BIST that can be easily implemented within a chip to enable efficient and accurate testing of a CAM structure.

A preferred embodiment provides a BIST for a CAM structure that may be implemented with a minimum amount of circuit overhead. For example, a preferred embodiment may be implemented for testing the integrity of a TLB CAM structure by simply adding a shift register and logic for generating test values. Furthermore, a BIST of a preferred embodiment may be further implemented to be capable of testing not only a CAM structure, but also a RAM structure. Such an implementation allows for both a CAM structure and RAM structure to be tested in an efficient manner utilizing a common BIST, and such a BIST may be implemented with very little circuit overhead.

It should be appreciated that a technical advantage of one aspect of the present invention is that a BIST implementation for a CAM structure is provided. A further technical advantage of one aspect of the present invention is that a CAM BIST implementation is provided, which allows for the integrity of a CAM structure to be tested in an efficient and accurate manner. For instance, in a preferred embodiment, a CAM BIST is implemented that is capable of performing a test in much less clock cycles than required for off-chip CAM tests of the prior art. Furthermore, in a preferred embodiment, a CAM BIST is implemented that is capable of performing a test at the processor clock speed, which may be a much faster speed than is typically utilized for off-chip testing programs. Still a further technical advantage of one aspect of the present invention is that a CAM BIST implementation is provided that requires very little circuit overhead to an existing CAM structure design. Yet a further technical advantage of one aspect of the present invention is that a BIST implementation is disclosed that may be utilized for both a CAM structure and a RAM structure.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

Figure 1:
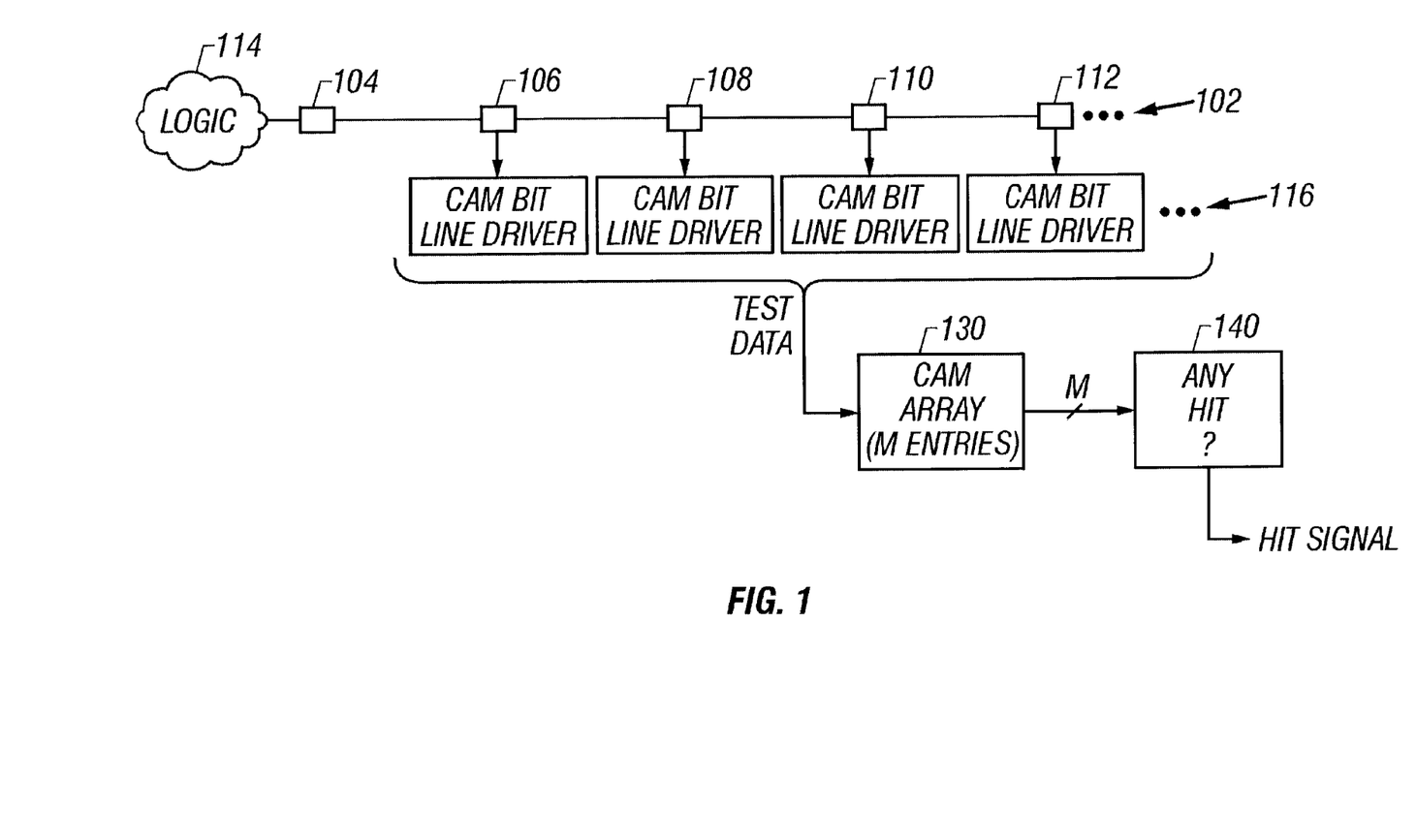
FIG. 1 shows a CAM BIST implementation of a preferred embodiment of the present invention.

Turning to FIG. 1, a preferred embodiment of the present invention is shown. The preferred embodiment of FIG. 1 provides a BIST implementation for a CAM structure. By providing a BIST for the CAM structure, the CAM testing can be accomplished in a much shorter period of time (e.g., much more efficiently) than is achieved utilizing prior art offchip testing programs. Shown in FIG. 1 is a CAM array 130, which may be a TLB for a cache. The BIST implementation of a most preferred embodiment is implemented to test a TLB CAM structure. However, the BIST of a preferred embodiment is not intended to be limited solely to a CAM structure implemented as a TLB. Rather, the BIST of a preferred embodiment may be implemented for testing any CAM structure, and any such implementation is intended to be within the scope of the present invention.

In a most preferred embodiment, CAM array 130 comprises 128 entries, each having 52 bits. However, CAM array 130 may be implemented having any number "M" of entries, with each entry having any size (i.e., any number of bits), and any such implementation is intended to be within the scope of the present invention. In a preferred embodiment, a shift register 102 is implemented for inputting various sequences of data into the CAM array 130. As shown in FIG. 1, in a most preferred embodiment shift register 102 comprises N+1 latches (e.g., latches 104, 106, 108, 110, and 112), wherein "N" is the number of bits of an entry of CAM array 130. More specifically, in a most preferred embodiment shift register 102 comprises "N" latches for inputting various sequences of data into the CAM array 130, and an additional "staging" latch (e.g., latch 104) that enables the appropriate sequence to be shifted into the latches of shift register 102. Of course, it should be recognized that any implementation now known or later developed may be utilized for shift register 102 to input data to CAM array 130, and the scope of the present invention is intended to encompass any such implementation. For instance, in an alternative embodiment, only "N" latches may be implemented in shift register 102 and logic 114 may be implemented to perform the task of the "staging" latch 104 of FIG. 1. In a preferred embodiment, the shift register 102 is as wide as the CAM structure 130. Accordingly, in a most preferred embodiment, each entry of CAM array 130 is 52 bits wide, and shift register 102 is also 52 bits wide (e.g., capable of storing 52 bits). However, in alternative embodiments, the CAM structure 130 and shift register 102 may be implemented having any width, and any such implementations are intended to be within the scope of the present invention.

A preferred embodiment also includes logic 114 that is operable to generate a sequence of values (1's and 0's) to be shifted into the shift register 102. Various sequences of values may be generated to comprise a test pattern for the CAM structure 130, as will become apparent with further discussion of the operation of a preferred embodiment. Logic 114 may be implemented in software, hardware, firmware, or any combination thereof, and any such implementation is intended to be within the scope of the present invention. Once values are shifted into shift register 102 via logic 114, CAM bit line drivers 116, which may also be referred to herein as "test address drivers," are utilized to drive the values from shift register 102 to the lines of CAM array 130. More specifically, CAM bit line drivers 116 drive the values of shift register 102 as a test data (or "test address") to CAM array 130. "Any hit" circuitry (or "compare circuitry") 140 is also included to determine whether a "hit" (or match) is made for a test address input to the CAM array and the data (or "addresses") stored as entries in the CAM array 130.

Figure 2A:
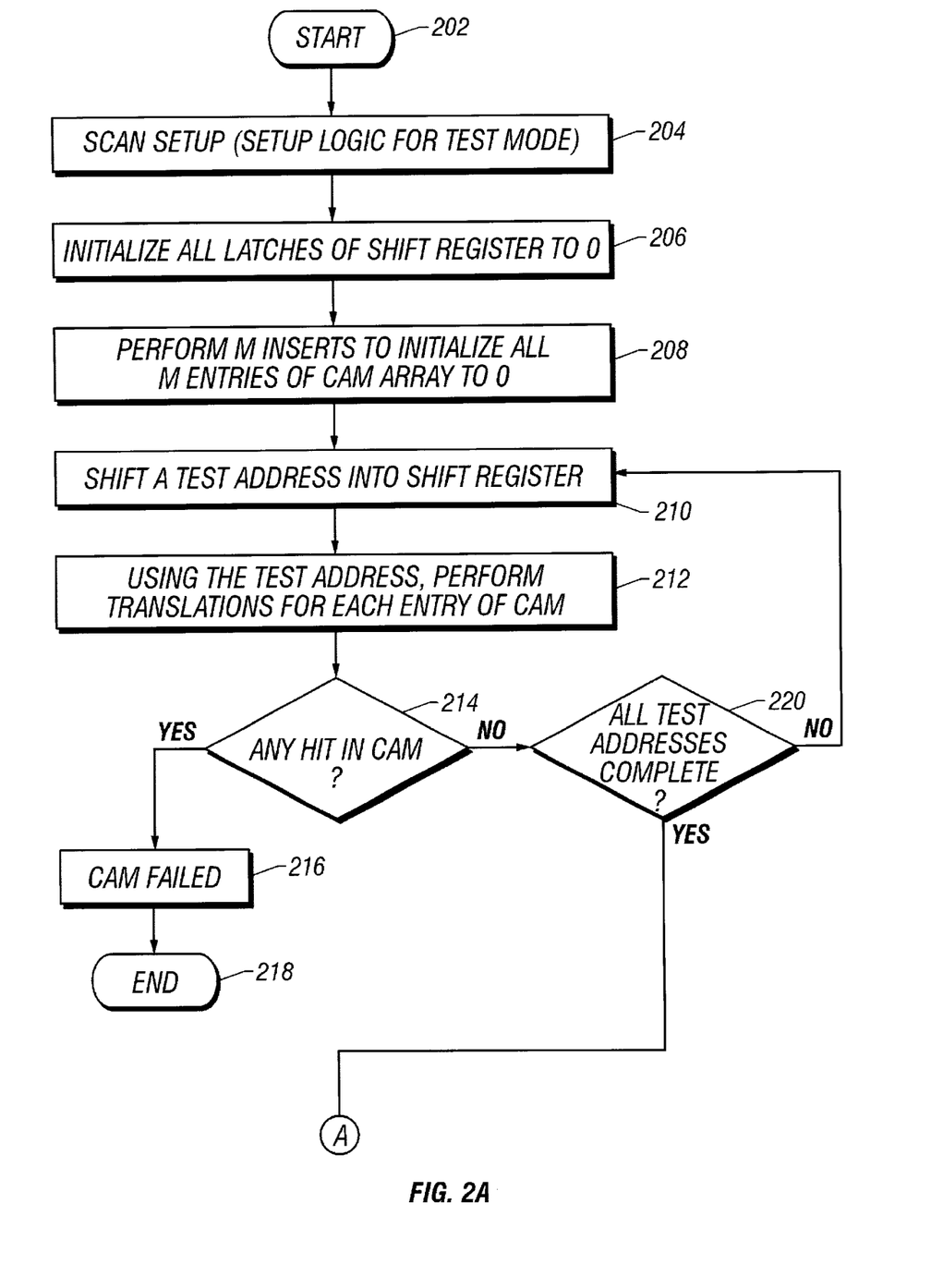
FIG. 2A shows an exemplary flow diagram of the operational flow of a CAM BIST of a preferred embodiment.
Figure 2B:
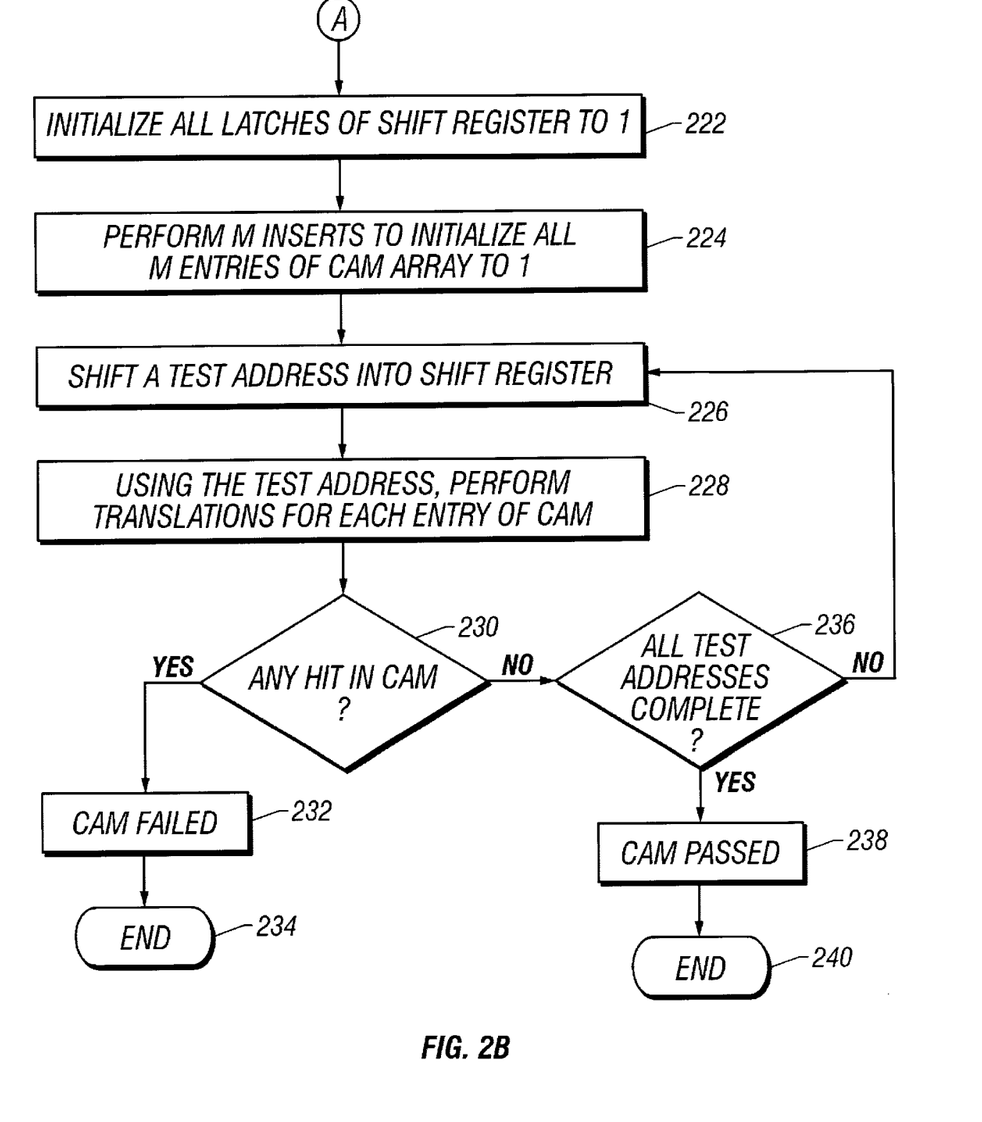
FIG. 2B further shows an exemplary flow diagram of the operational flow of a CAM BIST of a preferred embodiment.

Turning to FIGS. 2A and 2B, a flow diagram is provided to illustrate an exemplary operational flow of a preferred embodiment. In a most preferred embodiment, each entry of the CAM array 130 is first initialized to all 0's, and then a sequence of test addresses comprising all 0's with a walking 1 are input to the CAM array 130 to test for a false hit (i.e., a false match between the test addresses and the entries stored in the CAM array 130). Thereafter, each entry of the CAM array 130 is initialized to all 1's, and then a sequence of test addresses comprising all 1's with a walking 0 are input to the CAM array 130 to further test for a false hit. It should be recognized that the scope of the present invention is not intended to be limited to testing the CAM structure in this manner. Rather, any sequence/pattern now known or later developed for testing the CAM structure may be implemented, and any such implementation is intended to be within the scope of the present invention. Thus, the present invention is not intended to be limited only to the testing sequences/patterns provided herein, but rather such testing sequences/patterns are intended as examples that render the disclosure enabling for many other testing sequences/patterns that may be implemented for a CAM BIST.

As shown in FIG. 2A, the BIST of a preferred embodiment starts at block 202. Thereafter, at block 204, the logic 114 is setup for test mode. In response, logic 114 shifts 0's into all of the latches of shift register 102, thereby initializing shift register 102 to contain all 0's. At block 208, the CAM bit line drivers 116 are utilized to insert the address (or "data") from the shift register 102 (i.e., an address having every bit 0) into each entry of the CAM array 130. That is, "M" inserts of an address having every bit 0 (e.g., address= 00000000) are performed in order to initialize the "M" entries of CAM 130 to all 0's. Then, at block 210, logic 114 shifts a test address (or "test data") into the shift register 102. Most preferably, a 1 is scanned into the most significant bit and 0's scanned into the remaining bits of the shift register 102. Such a test address from the shift register 102 is input to the CAM array 130 at block 212 to determine whether a match (or "hit") is achieved for the test address in any of the entries of the CAM array 130. That is, the CAM array 130 attempts to perform a translation of such test address by determining whether any entry of the CAM array 130 matches the test address.

At block 214, "any hit" circuitry 140 determines whether any of the entries of the CAM array 130 match the test address. Of course, if a hit (match) is achieved for any of the entries, the CAM fails the BIST test at block 216 and the test ends at block 218. That is, because each of the CAM entries are all 0's, if a hit is obtained in an entry for a test address containing a 1, then the CAM array 130 is defective.

However, if a hit is not achieved at block 214, then at block 220 a determination is made as to whether a further test address is to be input to the CAM array 130. If all of the test addresses have not been completed (i.e., if the entire test pattern has not been completed), then the BIST's operation advances to block 210 to shift in the next test address, e.g., a test address having a 1 shifted or "walked" from the most significant bit over to the next most significant bit (test address=01000000). Once it is determined at block 220 that no more test addresses are required to be input to the CAM array 130 (e.g., the walking 1 has advanced all the way through the test address), then the BIST's operation may advance to block 222 of FIG. 2B.

At block 222, the logic 114 shifts 1's into all of the latches of shift register 102, thereby initializing shift register 102 to contain all 1's. At block 224, the CAM bit line drivers 116 are utilized to insert the address (or "data") from the shift register 102 (i.e., an address having every bit 1) into each entry of the CAM array 130. That is, "M" inserts of an address having every bit 1 (e.g., address=11111111) are performed in order to initialize the "M" entries of CAM 130 to all 1's. Then, at block 226, logic 114 shifts a test address (or "test data") into the shift register 102. Most preferably, a 0 is scanned into the most significant bit and 1's scanned into the remaining bits of the shift register 102. Such a test address from the shift register 102 is input to the CAM array 130 at block 228 to determine whether a match (or "hit") is achieved for the test address in any of the entries of the CAM array 130. That is, the CAM array 130 attempts to perform a translation of such test address by determining whether any entry of the CAM array 130 matches the test address.

At block 230, "any hit" circuitry 140 determines whether any of the entries of the CAM array 130 match the test address. Of course, if a hit (match) is achieved for any of the entries, the CAM fails the BIST test at block 232 and the test ends at block 234. That is, because each of the CAM entries are all 1's, if a hit is obtained in an entry for a test address containing a 0, then the CAM array 130 is defective. However, if a hit is not achieved at block 230, then at block 236 a determination is made as to whether a further test address is to be input to the CAM array 130. If all of the test addresses have not been completed (i.e., if the entire test pattern has not been completed), then the BIST's operation advances to block 226 to shift in the next test address, e.g., a test address having a 0 shifted or "walked" from the most significant bit over to the next most significant bit (test address=10111111). Once it is determined at block 236 that no more test addresses are required to be input to the CAM array 130 (e.g., the walking 0 has advanced all the way through the test address), then a determination may be made that the CAM array 130 passed the BIST 238, and the BIST operation may end at block 240.

Figure 3A:
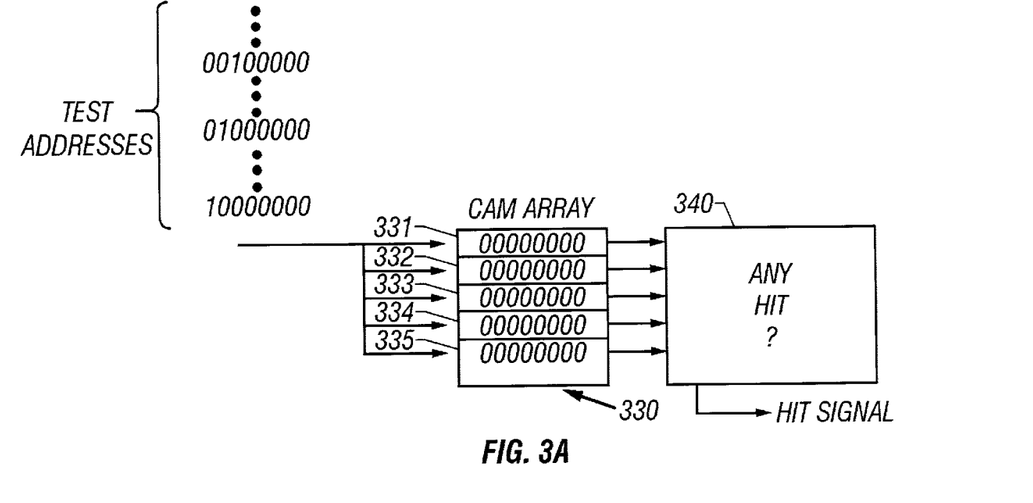
FIG. 3A shows a further example of a CAM BIST operation in which every bit of each entry of the CAM array is initialized to 0, and a pattern of test addresses having all 0's with a walking 1 are input to the CAM array for false hit testing.

Turning to FIG. 3, an example of the above-described BIST test is illustrated. As shown in FIG. 3A, a CAM array 330 may have every bit of each of its entries 331; 332, 333, 334, and 335 initialized to 0. For example, each entry may be initialized to 00000000. Thereafter, the test addresses comprising all 0's with a walking 1 are input to the CAM array 330, and "any hit" circuitry 340 outputs a "hit" signal indicating whether a hit was achieved for any of the entries of the CAM array 330. For example, a test address 10000000 may be compared with each of the CAM's entries. Thereafter, a test address 01000000 may be compared with each of the CAM's entries, followed by a test address 00100000, and so on. Because every bit of each of the entries 331, 332, 333, 334, and 335 was initialized to 0, if a hit (or match) is achieved in an entry for a test address having a 1 bit in it, then the CAM array 330 is defective.

Figure 3B:
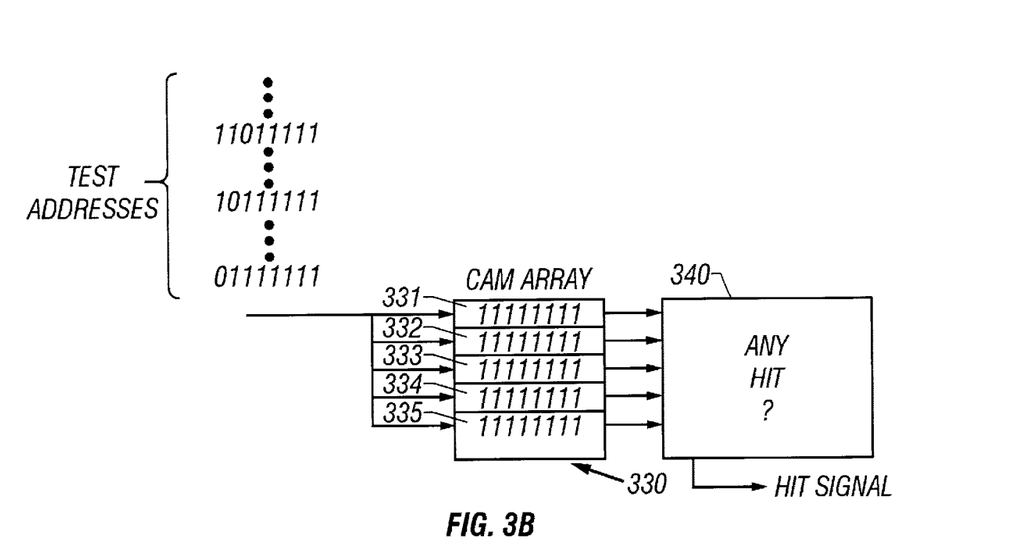
FIG. 3B shows a further example of a CAM BIST operation in which every bit of each entry of the CAM array is initialized to 1, and a pattern of test addresses having all 1's with a walking 0 are input to the CAM array for false hit testing.

As shown in FIG. 3B, CAM array 330 may then have every bit of each of its entries 331, 332, 333, 334, and 335 initialized to 1. For example, each entry may be initialized to 11111111. Thereafter, the test addresses comprising all 1's with a walking 0 are input to the CAM array 330, and "any hit" circuitry 340 outputs a "hit" signal indicating whether a hit was achieved for any of the entries of the CAM array 330. For example, a test address 01111111 may be compared with each of the CAM's entries. Thereafter, a test address 10111111 may be compared with each of the CAM's entries, followed by a test address 11011111, and so on. Because every bit of each of the entries 331, 332, 333, 334, and 335 was initialized to 1, if a hit (or match) is achieved in an entry for a test address having a 0 bit in it, then the CAM array 330 is defective.

In a preferred embodiment, the CAM BIST ensures that the CAM structure does not generate a false hit, as described above. In a most preferred embodiment, the CAM BIST also ensures that the CAM structure will actually generate a hit signal in an appropriate manner. For example, the CAM array may have its entries initialized to various patterns of data, and test patterns may be input to the CAM array to ensure that a matching entry generates a hit signal, as desired. For instance, each entry of a CAM array may include a "valid" bit associated therewith. Such a valid bit may be utilized to single out a particular entry for testing. Thus, for example, each entry of the CAM array may be initialized to a particular sequence of data (e.g., all zeros). The valid bit may be disabled (e.g., set to 0) for all of the entries except for the first entry which may have its valid bit enabled (e.g., set to 1). A matching sequence of data (i.e., matching the particular sequence to which each entry is initialized) may be input to the CAM array to ensure that the first entry generates a hit signal. Thereafter, the BIST may test each entry of the CAM in turn (e.g., by enabling only the valid bit associated with an entry and inputting a matching sequence to the CAM array. Furthermore, various sequences of data may be initialized in the CAM array, and then such sequences of data may be input thereto to ensure that each entry will generate an appropriate hit signal for the various sequences of data. By testing not only that the CAM array will not generate a false hit but also that the CAM array will generate a correct hit signal, it can be ensured that the match line for a CAM entry is not shorted to ground (resulting is always indicating a mismatch) or that no other defect is present in the CAM structure.

A preferred embodiment allows for testing of the CAM array 130 to be accomplished in a timely manner. That is, a preferred embodiment enables CAM array 130 to be tested in significantly less test time than required utilizing a serial, off-chip scan test of the prior art. As discussed above, in a preferred embodiment, the logic 114 is first setup to test mode. Such setup time requires approximately 10 clock cycles, in a preferred embodiment. However, more or less clock cycles may be required for alternative embodiments, and any such embodiment is intended to be within the scope of the present invention. Thereafter, an initial sequence of values (e.g., all 0's) is shifted into the shift register 102 from logic 114. In a preferred embodiment, N+1 clocks may be consumed to shift such initial sequence of values to the N+1 latches of shift register 102. For example, for a most preferred embodiment in which a 52 bit shift register is implemented, approximately 53 clock cycles are consumed for shifting such initial sequence of values to the shift register 102.

Then "M" number of inserts are performed to initialize the "M" entries of CAM array 130 to the initial sequence of values of the shift register 102 (e.g., to initialize every bit of each entry of the CAM array 130 to a 0). For example, for a most preferred embodiment in which 128 entries are implemented in CAM array 130, approximately 128 clock cycles are consumed for initializing the "M" entries of CAM array 130 to 0. Thereafter, "M" translations are performed to check for any hits (matches) between the CAM array entries and a test address (e.g., a test address having all 0's with a walking 1). For a most preferred embodiment, in which 128 entries are implemented in CAM array 130, approximately 128 clock cycles are consumed for performing such translations. More specifically, in a preferred embodiment, all of the entries of the CAM array 130 are tested in parallel, and approximately 128 clock cycles are required for determining whether a hit signal is generated by any of the CAM's entries. Finally, a hit signal is scanned out of "any hit" circuitry 140 to determine whether any hits were detected for a test address within the CAM array 130.

Accordingly, a preferred embodiment requires much less clock cycles than the many millions of cycles typically required in prior art implementations. For example, approximately 320 clock cycles are required to perform the above test in a preferred embodiment. As discussed above, a preferred embodiment then initializes every bit of each entry of the CAM array 130 to 1, and tests the CAM array 130 using a test address (e.g., a test address having all 1's and a walking 0). Accordingly, approximately 320 additional clock cycles may be required to perform this test pattern. As a result, a preferred embodiment may allow for a 128 entry CAM array (with each entry having 52 bits) to be tested in the above manner in approximately 640 clock cycles. Prior art off-chip testing programs typically require thousands of clock cycles to perform such a CAM test. Thus, a significant reduction in the number of required clock cycles is enabled by the BIST of a preferred embodiment.

Moreover, in a preferred embodiment, the CAM testing can be performed "at speed." That is, the BIST of a preferred embodiment enables CAM testing to be performed at clock processor speed, whereas prior art off-chip testing programs typically are serial clock tests that operate at approximately 10 MHz. Thus, for example, if a processor operates at 500 MHz, the BIST of a preferred embodiment can be executed at such 500 MHz speed, rather than being required to operate at approximately 10 MHz, as with prior art off-chip testing programs. As a result, the BIST of a preferred embodiment enables CAM testing to be accomplished in significantly less time than was capable utilizing prior art CAM testing programs.

It should be recognized that very little additional circuitry is required to implement the BIST of a preferred embodiment. For instance, when the BIST is implemented for a TLB CAM structure, as shown and described for the preferred embodiment of FIG. 1, the only additional circuitry that may be added to the CAM structure is the shift register 102 and logic 114 (which may be implemented as hardware, software, firmware, or any combination thereof). Shift register 102 is generally an inexpensive component to implement and is also relatively small in size. When the BIST of a preferred embodiment is implemented for a TLB CAM structure, the "any hit" circuitry 140 and the CAM bit line drivers 116 are typically already implemented for the TLB's design. As a result, very little overhead is required to implement the BIST of a preferred embodiment within a TLB CAM structure. It should also be recognized that very little overhead is required to implement the BIST of a preferred embodiment for any other CAM structure. More specifically, a BIST of a preferred embodiment may be implemented for non-TLB CAM structures by adding a shift register 102 (an additional shift register may be implemented for some CAM structure implementations, in a similar manner as discussed below for a RAM implementation), logic 114, and compare circuitry, such as any hit circuitry 140, to such CAM structures.

Figure 4:
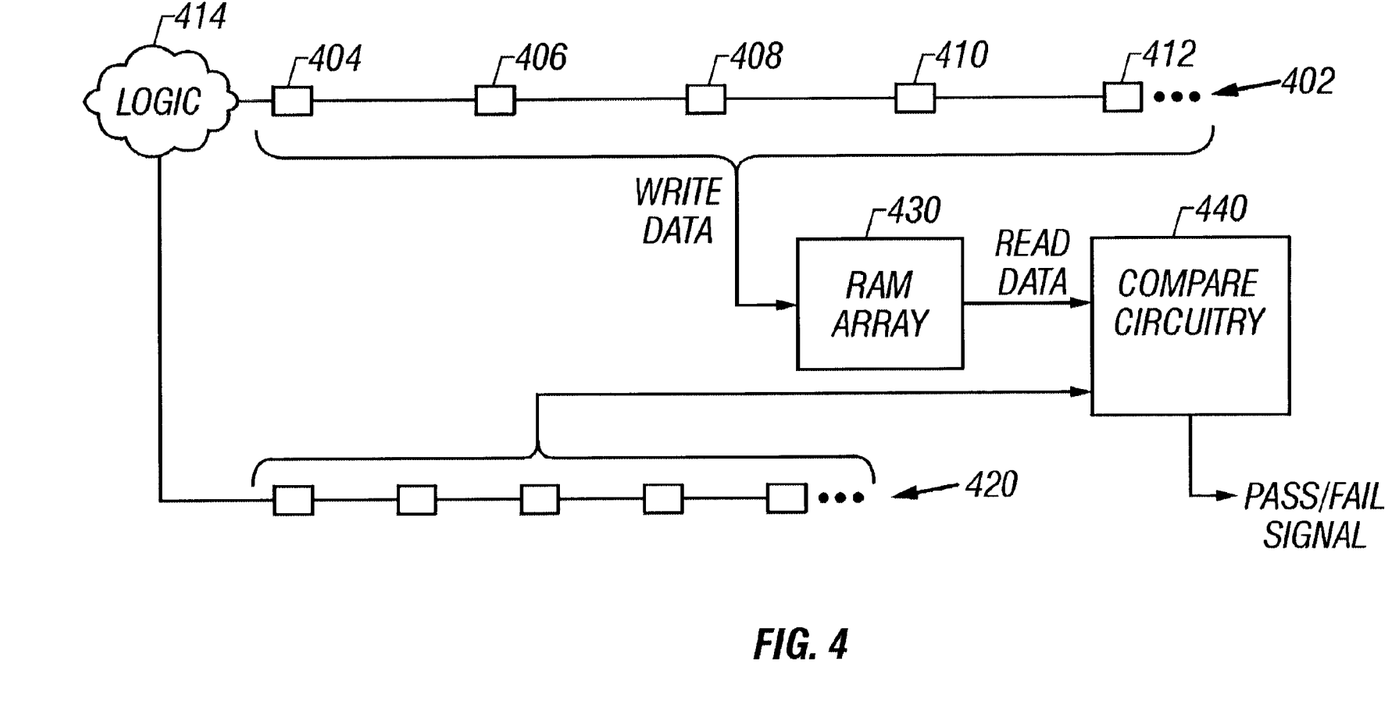
FIG. 4 shows a CAM BIST of a preferred embodiment implemented to also serve as a BIST for a RAM structure.

Furthermore, a preferred embodiment may be implemented to provide a BIST not only for a CAM structure, but also for a RAM structure. Thus, in a preferred embodiment, a BIST may be implemented to be utilized not only for a CAM structure, but also for a RAM structure. Turning to FIG. 4, an exemplary implementation of a BIST of a preferred embodiment capable of being utilized for a RAM structure is shown. As shown, a shift register 402, which comprises latches 404, 406, 408, 410, and 412, is implemented to receive sequences/patterns from a logic 414, which may be implemented in hardware, software, firmware, or any combination thereof. Thus, for example, "write data" may be shifted from logic 414 to shift register 402 to be inserted into (i.e., written to) RAM array 430.

In the RAM BIST implementation shown in FIG. 4, a second shift register 420 (which may be referred to herein as a "duplicate" shift register) is implemented, which also receives from logic 414 the sequence/pattern of data that was written from shift register 402 to RAM array 430. That is, shift register 420 receives a duplicate of the data shifted into shift register 402. Accordingly, the data may be read from RAM array 430 and compared with the data of shift register 420 in compare circuitry 440 (e.g., "any hit" circuitry), which outputs a pass/fail signal (or "hit" signal). When the data is read from the RAM array 430, the data read from the RAM array 430 should match what was actually written into the duplicate shift register 420. Thus, if the data read from RAM array 430 matches the data of shift register 420, then the compare circuitry 440 outputs a "pass" signal because the data was correctly written to and read from the RAM array 430. However, if the data read from RAM array 430 does not match the data of shift register 420, then the compare circuitry 440 outputs a "fail" signal because the data was not correctly written to and/or read from the RAM array 430, indicating that RAM array 430 is defective.

Various BISTs have been implemented in the prior art for RAM structures. However, a preferred embodiment of the present invention may be implemented as a BIST for both CAM structures and RAM structures, thereby providing greater utility. It should be recognized that very little overhead is required to implement the BIST of a preferred embodiment for a RAM structure. As shown in FIG. 4, the CAM BIST implementation of FIG. 1 may be utilized not only for a CAM structure, but also for a RAM structure, by implementing an additional shift register (e.g., shift register 420). Additionally, the comparator 440 may need to be added for the RAM BIST implementation because the "any hit" circuitry 140 of FIG. 1 may be an existing part of the TLB CAM structure 130.

It should be understood that any test sequence and pattern of test sequences may be implemented for a BIST of the present invention, and any such implementation is intended to be within the scope of the present invention. Additionally, it should be understood that a test sequence/pattern may comprise a sequence intended to match the data within a RAM and/or CAM structure. For example, every bit of each entry of a CAM array 130 may be initialized to 0, and a test address having all 0's may be input to the CAM array 130 to ensure that a hit is achieved for every entry. Thus, it should be recognized that a preferred embodiment provides a BIST for testing the integrity of a CAM/RAM structure to ensure that such structure(s) operate correctly.

It should be understood that a BIST of the present invention may be implemented within any type of chip comprising a CAM structure or comprising both CAM and RAM structures. The CAM structure of the present invention may be implemented as a TLB or may be implemented for any other component utilizing a CAM structure. For example, the CAM structure of the present invention may be implemented for video drivers, disk drive controllers, graphic controllers, CEC chips, microprocessor chips, and any other type of chip that includes a CAM structure. It should also be understood that a BIST of the present invention may be implemented within any type of computer system having a processor, including but not limited to a personal computer (PC), laptop computer, and personal data assistant (e.g., a palmtop PC).

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of testing the integrity of a content addressable memory (CAM) structure that has a plurality of entries each having N number of bits, wherein N is greater than 1, said method comprising:

initializing each of said plurality of entries of said CAM structure to a first value using built-in test circuitry;

generating at least N test values using said built-in test circuitry, wherein each of said N test values has one bit that is different from a corresponding bit of said first value; and for each of said generated N test values, comparing bits of the test value with corresponding bits of each of said plurality of entries in parallel, wherein read circuitry is not required for reading said first value out of said CAM structure.

2. The method of claim 1 wherein said comparing step uses said CAM structure's compare circuitry.

3. The method of claim 1 wherein said comparing step outputs a match signal if a match is recognized between the test value and at least one of said entries, and outputs a no match signal if no such match is recognized.

4. The method of claim 3 further including the step of concluding that staid CAM structure fails an integrity test if said comparing step outputs a match signal.

5. The method of claim 1 further comprising:

generating at least one test value the same as said first value; and comparing in parallel for said plurality of entries bits of said at least one test value with corresponding bits of said plurality of entries.

6. The method of claim 1 further including the steps of:

initializing each of said plurality of entries of said CAM structure to a second value using said built-in test circuitry;

generating a second set of at least N test values using said built-in test circuitry, wherein each of said second set of N test values has one bit that is different from a corresponding bit of said second value; and for each of said second set of generated N test values, comparing bits of the test value with corresponding bits of each of said plurality of entries in parallel.

7. The method of claim 1 further including the steps of:

initializing said plurality of entries of said CAM structure to at least one pattern of values using built-in-test circuitry;

generating at least one pattern of test values using said built-in test circuitry; and comparing in parallel for said plurality of entries said at least one pattern of values with said at least one pattern of test values.

8. The method of claim 1 further including the step of:

using said test circuitry to test the integrity of a random access memory (RAM) structure.

9. A computer system comprising:

at least one processor that executes instructions;

content addressable memory (CAM) structure that has a plurality of entries each having N number of bits, wherein N is greater than 1 and wherein said CAM structure is accessible by said processor to satisfy memory access requests;

said CAM structure comprising built-in circuitry for testing the integrity of said CAM structure, wherein said built-in circuitry does not require circuitry for reading memory data out of said CAM to test the integrity of said CAM structure;

said built-in circuitry comprising
   (a) logic for storing a first value to each of said plurality of entries of said CAM structure,
   (b) logic that generates at least N test values, wherein each of said N test values has one bit that is different from a corresponding bit of said first value, and
   (c) compare circuitry operable to compare each of said generated N test values with said entries, wherein for each of said generated N test values said compare circuitry compares bits of the test value with corresponding bits of each of said plurality of entries in parallel to determine in parallel for said plurality of entries whether the test value matches any of said plurality of entries.

10. The computer system of claim 9 wherein said CAM structure is a translation look-aside buffer for cache.

11. The computer system of claim 9 wherein said built-in circuitry further includes:

register for temporarily storing said at least one of said N test values.

12. The computer system of claim 9 wherein said compare circuitry outputs a match signal if a match is recognized between the test value and at least one of said entries, and outputs a no match signal if no such match is recognized.

13. The computer system of claim 12 wherein said built-in circuitry concludes that said CAM structure fails an integrity test if said compare circuitry outputs a match signal.

14. The computer system of claim 9 further comprising:

a random access memory (RAM) structure, wherein said built-in circuitry is further operable for testing the integrity of said RAM structure.

15. An integrated circuit comprising:
content addressable memory (CAM) structure that has a plurality of entries each having N number of bits, wherein N is greater than 1; and
means for testing tie integrity of said CAM structure, wherein said testing means does not require a means for reading memory data out of said CAM structure and wherein said testing means comprises
means for storing a first value to each of said plurality of entries,
means for generating at least N test values, wherein each of said N test values has one bit that is different from a corresponding bit of said first value, and
means, operable for each of said generated N test values, for comparing bits of the test value with corresponding bits of each of said plurality of entries in parallel.

16. The integrated circuit of claim 15 wherein said CAM structure is a translation look-aside buffer for cache.

17. The integrated circuit of claim 15 wherein staid means for comparing includes the compare circuitry of said CAM structure.

18. The integrated circuit of claim 15 wherein said means for comparing outputs a match signal if a match is recognized between the test value and at least one of said entries, and outputs a no match signal if no such match is recognized.

19. The integrated circuit of claim 18 wherein said testing means concludes that said CAM structure fails an integrity test if said comparing means outputs a match signal.

20. The integrated circuit of claim 15 wherein said testing means is capable of being used for testing the integrity of a random access memory (RAM) structure.

* * * * *

UNITED STATES PATENT AND TRADEMARK OFFICE
CERTIFICATE OF CORRECTION

PATENT NO. : 6,550,034 B1
DATED : April 15, 2003
INVENTOR(S) : Reid James Riedlinger et al.

It is certified that error appears in the above-identified patent and that said Letters Patent is hereby corrected as shown below:

Column 11,
Line 59, delete "staid" and insert therfor -- said --

Column 13,
Line 6, delete "tie" and insert therefor -- the --

Column 14,
Line 3, delete "staid" and insert therefor -- said --

Signed and Sealed this

Twelfth Day of October, 2004

JON W. DUDAS
*Director of the United States Patent and Trademark Office*